(12) United States Patent
Lee et al.

(10) Patent No.: US 9,576,973 B2
(45) Date of Patent: Feb. 21, 2017

(54) SEMICONDUCTOR DEVICE AND METHOD OF MANUFACTURING THE SAME

(71) Applicant: SK hynix Inc., Gyeonggi-do (KR)

(72) Inventors: Hyun Ho Lee, Gyeonggi-do (KR); Jong Man Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/821,445

(22) Filed: Aug. 7, 2015

(65) Prior Publication Data

US 2016/0260735 A1    Sep. 8, 2016

(30) Foreign Application Priority Data

Mar. 3, 2015   (KR) .................. 10-2015-0029782

(51) Int. Cl.
| | | |
|---|---|---|
| *H01L 29/792* | (2006.01) | |
| *H01L 27/115* | (2006.01) | |
| *H01L 21/28* | (2006.01) | |
| *H01L 23/528* | (2006.01) | |
| *H01L 23/532* | (2006.01) | |
| *H01L 21/768* | (2006.01) | |

(52) U.S. Cl.
CPC ... *H01L 27/11582* (2013.01); *H01L 21/28282* (2013.01); *H01L 21/768* (2013.01); *H01L 23/528* (2013.01); *H01L 23/5329* (2013.01); *H01L 23/53257* (2013.01)

(58) Field of Classification Search
CPC .................. H01L 21/31144; H01L 21/32139; H01L 27/11565; H01L 27/1157; H01L 27/11582; H01L 29/42356; H01L 21/28282; H01L 21/768; H01L 23/528; H01L 23/53257; H01L 23/5329
USPC ... 257/324, 314, 774, 329; 365/63; 438/702, 438/268
See application file for complete search history.

(56) References Cited

U.S. PATENT DOCUMENTS

| | | | | |
|---|---|---|---|---|
| 2013/0134493 | A1* | 5/2013 | Eom .................. | H01L 29/7926 257/314 |
| 2014/0063890 | A1* | 3/2014 | Lee .................. | H01L 27/11519 365/63 |
| 2015/0235939 | A1* | 8/2015 | Lee .................. | H01L 27/11565 257/774 |
| 2016/0071870 | A1* | 3/2016 | Minami ............ | H01L 27/11582 257/314 |

FOREIGN PATENT DOCUMENTS

| | | |
|---|---|---|
| KR | 1020140031755 | 3/2014 |
| KR | 1020140117212 | 10/2014 |

* cited by examiner

*Primary Examiner* — Mohammed Shamsuzzaman
(74) *Attorney, Agent, or Firm* — IP & T Group LLP

(57) ABSTRACT

Disclosed is a semiconductor device, including: stack structures including interlayer insulating patterns and conductive line patterns, which are alternately stacked, and separated by a first slit; string pillars passing through the stack structures; and dummy holes passing through top portions of the stack structures to be spaced apart from bottom surface of the stack structures and disposed between the string pillars.

8 Claims, 14 Drawing Sheets

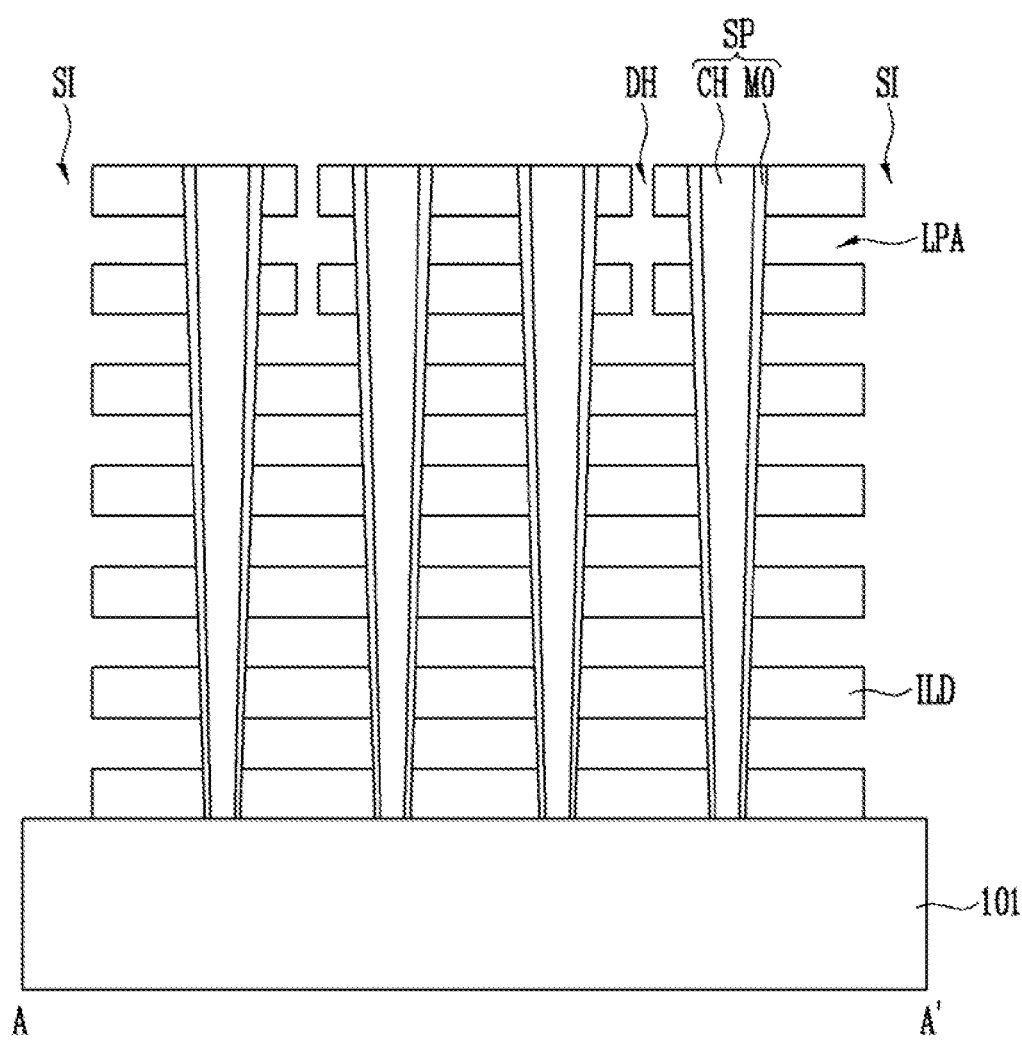

STACK DIRECTION(III)

ROW DIRECTION(I)

COLUMN DIRECTION(II)

SEMICONDUCTOR DEVICE AND METHOD OF MANUFACTURING THE SAME

CROSS-REFERENCE TO RELATED APPLICATION

The present application claims priority to Korean patent application number 10-2015-0029782, filed on Mar. 3, 2015, the entire disclosure of which is herein incorporated by reference in its entirety.

BACKGROUND

1. Field

The present invention relates to a semiconductor device and a method of manufacturing the same, and more particularly, to a semiconductor device including a three-dimensional memory device and a method of manufacturing the same.

2. Discussion of Related Art

A semiconductor device includes a memory device capable of storing data. Recently, a three-dimensional (3D) memory device has been suggested for high integration of the semiconductor device.

The 3D memory device includes memory cells three-dimensionally arranged on a substrate. The memory cells may be serially connected to each other and coupled to a single memory string through a channel layer.

In a conventional method of forming the 3D memory device, sacrificial insulating layers are replaced with gate material layers. The process of replacing the sacrificial insulating layers with the gate material layers may cause various process defects, thereby degrading reliability of the 3D memory device.

SUMMARY

The present invention provides a semiconductor device capable of improving reliability of a three-dimensional (3D) memory device, and a method of manufacturing the same.

An exemplary embodiment of the present invention provides a semiconductor device, including: stack structures including interlayer insulating patterns and conductive line patterns, which are alternately stacked, and separated by a first slit; string pillars passing through the stack structures; and dummy holes passing through top portions of the stack structures to be spaced apart from bottom surface of the stack structures and disposed between the string pillars.

Another exemplary embodiment of the present invention provides a method of manufacturing semiconductor device, including: alternately stacking interlayer insulating layers and sacrificial layers; forming string pillars passing through the interlayer insulating layers and the sacrificial layers; forming a first slit and dummy holes each passing through the interlayer insulating layers and the sacrificial layers, wherein the first slit has a different depth from the dummy holes; opening line pattern areas by removing the sacrificial layers through the first slit and the dummy holes; and forming conductive line patterns within the line pattern area.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, an exemplary embodiment will be described in detail with reference to the accompanying drawings. However, the present invention is not limited to the exemplary embodiments disclosed below.

Figure 1A:
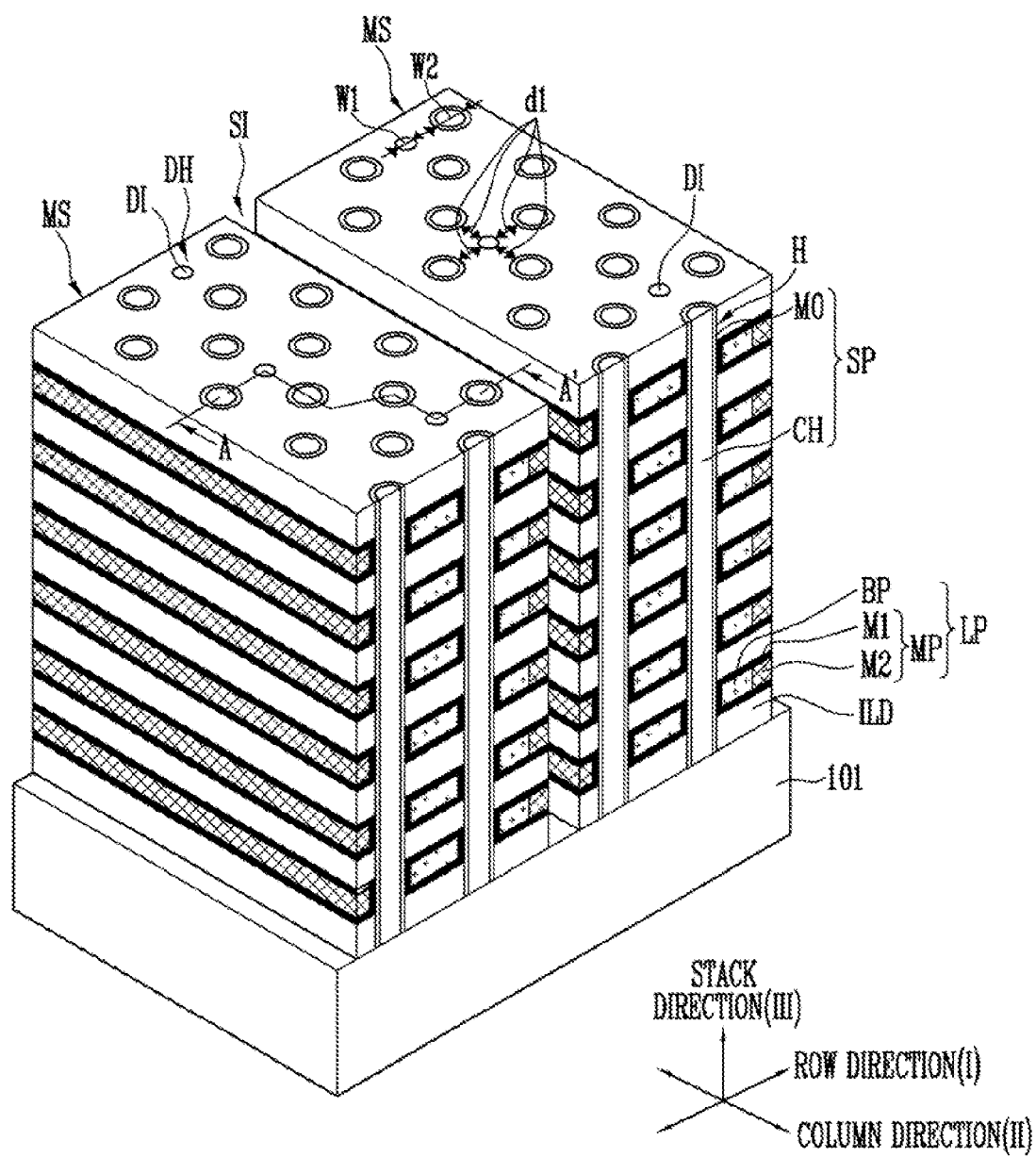
FIGS. 1A and 1B are diagrams illustrating a semiconductor device according to an exemplary embodiment of the present invention.
Figure 1B:
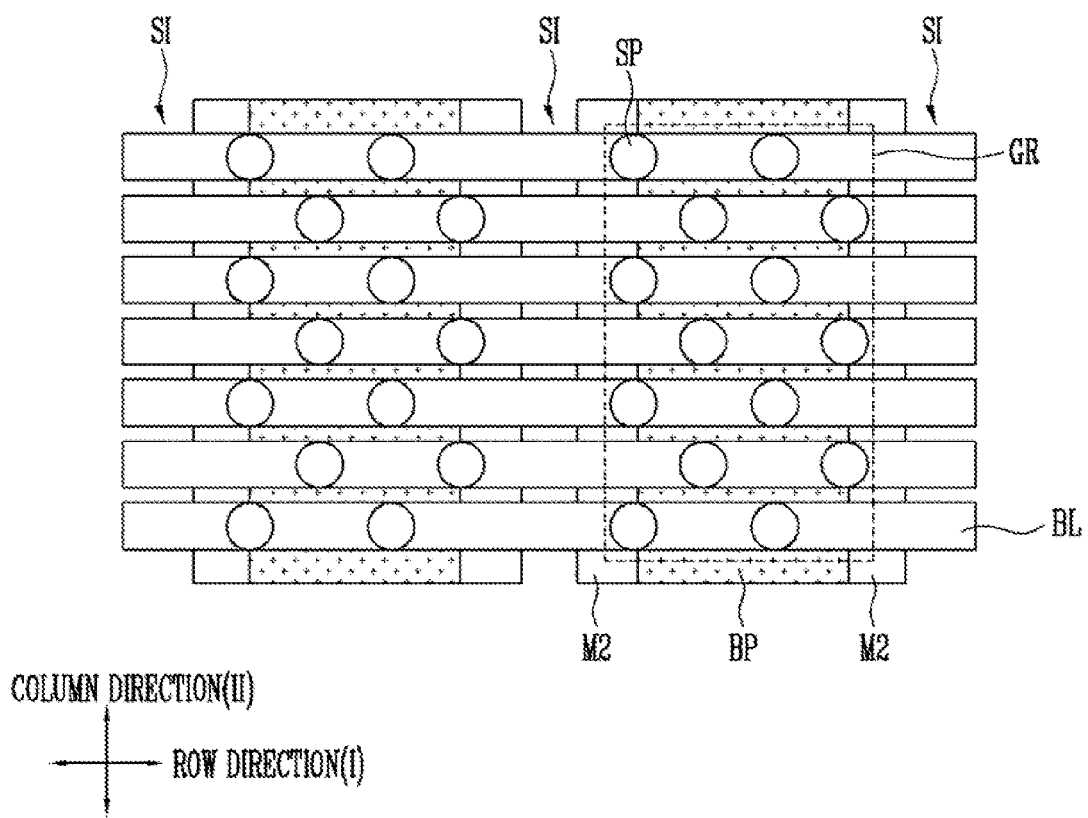

FIGS. 1A and 1B are diagrams illustrating a semiconductor device according to an exemplary embodiment of the present invention. More particularly, FIG. 1A is a perspective view of a three-dimensional (3D) memory device according to an exemplary embodiment of the present invention, and FIG. 1B is a top plan view for describing a connection relationship between string pillars and a bit line of the 3D memory device illustrated in FIG. 1A.

Referring to FIG. 1A, the 3D memory device according to the exemplary embodiment of the present invention includes a stack structure MS, a string pillar SP extending through the stack structures MS in a third direction III, and a dummy hole DH extending into the stack structure MS in the third direction III. For example, the third direction III is a vertical direction. The string pillar SP and the dummy hole DH may extend in parallel to each other and may pass through the stack structure MS. The dummy hole DH may pass through a top portion of the stack structure MS and is spaced apart from a bottom surface of the stack structure MS.

A plurality of string pillars SP may be arranged in various formed in a row direction I that is, a first direction, and a column direction II that is, a second direction. The row direction I and the column direction II may be perpendicular to each other. Both of the row direction I and the column direction II may be perpendicular to the third direction. The string pillars SP are disposed inside channel holes H passing through a plurality of stack structures MS, respectively. The string pillars SP are divided into groups. The string pillars SP in a same group are surrounded by one corresponding stack structure MS.

The string pillars SP in the same group may pass through one corresponding stack structure MS, and be disposed in a plurality of rows and a plurality of columns. To dispose a large number of string pillars SP within a given unit area, the string pillars SP may be disposed in zigzag in the row direction I and the column direction II.

Each of the string pillars SP includes a channel pillar CH and a memory layer MO surrounding an outer wall of the channel pillar CH. The channel pillar CH may include a tube-type semiconductor layer and extend along an internal wall of the memory layer MO. An insulating layer filled in a center region of the tube-type semiconductor layer. In another embodiment, the channel pillar CH may include a buried semiconductor layer formed over the internal wall of the memory layer MO and filling each of the channel holes H. In another embodiment, the channel pillar CH may be formed in a combination type of the buried semiconductor layer and the tube-type semiconductor layer.

The memory layer MO may include a tunnel insulating layer, a data storing layer, and a blocking insulating layer and surround the channel pillar CH. The tunnel insulating layer is in contact with the channel pillar CH and surrounds the channel pillar CH. The data storing layer surrounds the channel pillar CH so that the tunnel insulating layer is interposed between. The blocking insulating layer surrounds the channel pillar CH so that the data storing layer and the tunnel insulating layer are interposed therebetween.

The tunnel insulating layer may be formed of a silicon oxide layer, and the data storing layer may be formed of a material layer having charge trap characteristics. For example, the data storing layer may be formed of a silicon nitride layer. The blocking insulating layer may include a silicon oxide layer. The blocking insulating layer may include a high dielectric layer having a higher dielectric constant than that of a silicon oxide layer.

The stack structure MS may be divided by a first slit SI. The stack structure MS includes interlayer insulating patterns ILD and conductive line patterns LP alternately stacked on a lower structure 101. A stack direction III, that is, the third direction, of the interlayer insulating patterns ILD and the conductive line patterns LP is the same as an extension direction of the string pillars SP. The lower structure 101 may include a pipe gate in which the pipe channel is embedded. In another embodiment, the lower structure 101 may be a substrate including a source area or a source line. A particular example of the lower structure 101 will be described below with reference to FIGS. 7 and 8.

An upper conductive line pattern(s) adjacent to an upper surface of each of the stack structures MS may serve as select lines. The upper conductive line pattern is one of the conductive line patterns LP. Lower conductive line patterns, which are located under the upper conductive line pattern, may serve as word lines. In another embodiment, an upper conductive line pattern(s) adjacent to an upper surface of each of the stack structures MS and a lower conductive line pattern(s) adjacent to the lower structure 101 may serve as select lines. The upper conductive line pattern may be one of the conductive line patterns LP and the lower conductive line pattern may be one of the conductive line patterns LP. The remaining conductive line patterns between the upper conductive fine pattern and the lower conductive line pattern may be used as word lines.

Each of the conductive line patterns LP is formed in a line pattern area between the adjacent interlayer insulating patterns ILD. Each of the conductive line patterns LP may be extended in the column direction I. Each of the conductive line patterns LP may include a non-conductive pattern BP and a conductive pattern MP surrounding the non-conductive pattern BP. The conductive pattern MP may include a first conductive pattern M1 and a second conductive pattern M. The non-conductive pattern BP is surrounded by the first and second conductive patterns M1 and M2.

The line pattern area between the adjacent interlayer insulating patterns ILD is divided into a first portion and a second portion. The first portion includes a space between the string pillars SP, and the second portion includes an edge of the line pattern area adjacent to the first slit SI. The second portion may extend from the first portion.

The string pillars SP in the same group may be arranged by a plurality of columns. The columns of string pillars SP include outermost columns adjacent to the first slit SI. The first portion may be disposed between outermost columns of the string pillars SP.

The first conductive pattern M1 is formed along surfaces of the first portion and the second portion of the line pattern area. Accordingly, the first conductive pattern M1 may be formed along surfaces of the interlayer insulating patterns ILD and surfaces of the string pillars SP. The first conductive pattern M1 is divided by the first slit SI and the dummy holes DH.

The non-conductive pattern BP is formed on the first conductive pattern M1 and fills in the first portion of the line pattern area. The non-conductive pattern BP is in contact with the first conductive pattern M1. The non-conductive pattern BP does not extend to the second portion of the line pattern area. The non-conductive pattern BP may fill inside the dummy hole DH. A part of the non-conductive pattern BP inside the dummy hole DH is used as a dummy insulating plug DI. The dummy insulating plug DI filling in the dummy hole DH and the non-conductive pattern BP may be connected together and formed of same non-conductive materials.

The second conductive pattern M2 is formed on the first conductive pattern M1 and fills in the second portion of the line pattern area. Accordingly, the second conductive pattern M2 is in contact with the first conductive pattern M1 and the non-conductive pattern BP. The second conductive pattern M2 may be divided by the first slit SI.

The first conductive pattern M1 may be formed of barrier metal to prevent metal from diffusing from the second conductive pattern M2 to the memory layers MO of the string pillars SP. For example, the first conductive pattern M1 may include a titanium layer, a titanium nitride layer, a tantalum layer, a tantalum nitride layer, or a combination thereof.

The non-conductive pattern BP may be formed of a material which does not generate fume that damages the memory layer MO and the like. For example, the non-conductive pattern BP may include an oxide layer, a nitride layer, a silicon oxide layer, a silicon nitride layer, or a combination thereof.

The second conductive pattern M2 may include a metal capable of reducing resistance of the conductive line pattern LP. More particularly, the second conductive pattern M2 may include a metal having lower resistance than that of poly silicon. For example, the second conductive pattern M2 may include a tungsten layer, a tungsten nitride layer, or a combination thereof.

The dummy holes DH may pass through the stack structures MS to a predetermined depth, respectively. The dummy holes OH may be disposed between the string pillars SP. The dummy holes DH are spaced apart from the string pillars SP by a predetermined distance d1. The dummy holes DH may be disposed in zigzag and pass through the stack structures MS, respectively. Although not illustrated in the drawing, the dummy holes DH may be disposed between every string pillar SP. The dummy holes DH are formed as a hole type and spaced apart from each other to prevent each layer of the stack structures MS from being separated. When the dummy holes DH are formed as a line type, the each layer of the stack structures MS may be separated into line portions by the dummy holes DH. An upper portion of the dummy hole DH may be formed wider than a lower portion of the dummy hole DH due to a characteristic of an etch process for forming the dummy holes DH. Thus, it may be difficult to secure a uniform interval between the dummy holes OH and the string pillars SP. This phenomenon may be degenerated when a depth of each of the dummy holes DH is as deep as a depth of each string pillar SP or the first slit SI.

To address this issue, a depth of the dummy hole DH measured from the upper surface of the stack structure MS may be formed shorter than either a depth of the string pillar SP or a depth of the first slit SI measured from the upper surface of the stack structure MS. Further, a width W1 of the dummy hole DH may be formed smaller than a width W2 of the string pillar SP. Accordingly, it is not necessary to increase the interval between the string pillars SP considering the width W1 of the dummy hole OH. Thus, the structure of the dummy holes DH according to the exemplary embodiment of the present invention is advantageous for high integration of the 3D memory device.

Referring to FIG. 1B, the conductive line patterns LP within the same plane may be divided by the first slit SI. See FIG. 1A. The string pillars SP may be disposed in zigzag in the row direction I and the column direction II, and are connected to bit lines BL.

The bit lines BL may be disposed on the stack structures MS shown in FIG. 1A. The bit lines BL may be extended in the row direction I. The string pillars SP are serially disposed in an extension direction of the bit lines BL. The string pillars SP arranged in the same row may be connected to the same bit line.

The string pillars SP may be divided into groups GR. Each of the groups GR passes through corresponding conductive line patterns LP. The string pillars SP in the same group may be arranged by a plurality of columns. The columns of string pillars SP include outermost columns adjacent to the first slits SI. The non-conductive pattern BP of the conductive line pattern LP is disposed between the outermost columns of the string pillars SP, and the second conductive pattern M2 is formed between the non-conductive pattern BP and the first slit SI.

FIGS. 2A to 4C are diagrams for describing a method of manufacturing the semiconductor device according to the exemplary embodiment of the present invention. More particularly, FIGS. 2A to 4C are diagrams for describing a method of manufacturing the 3D memory device illustrated in FIGS. 1A and 1B.

Figure 2A:
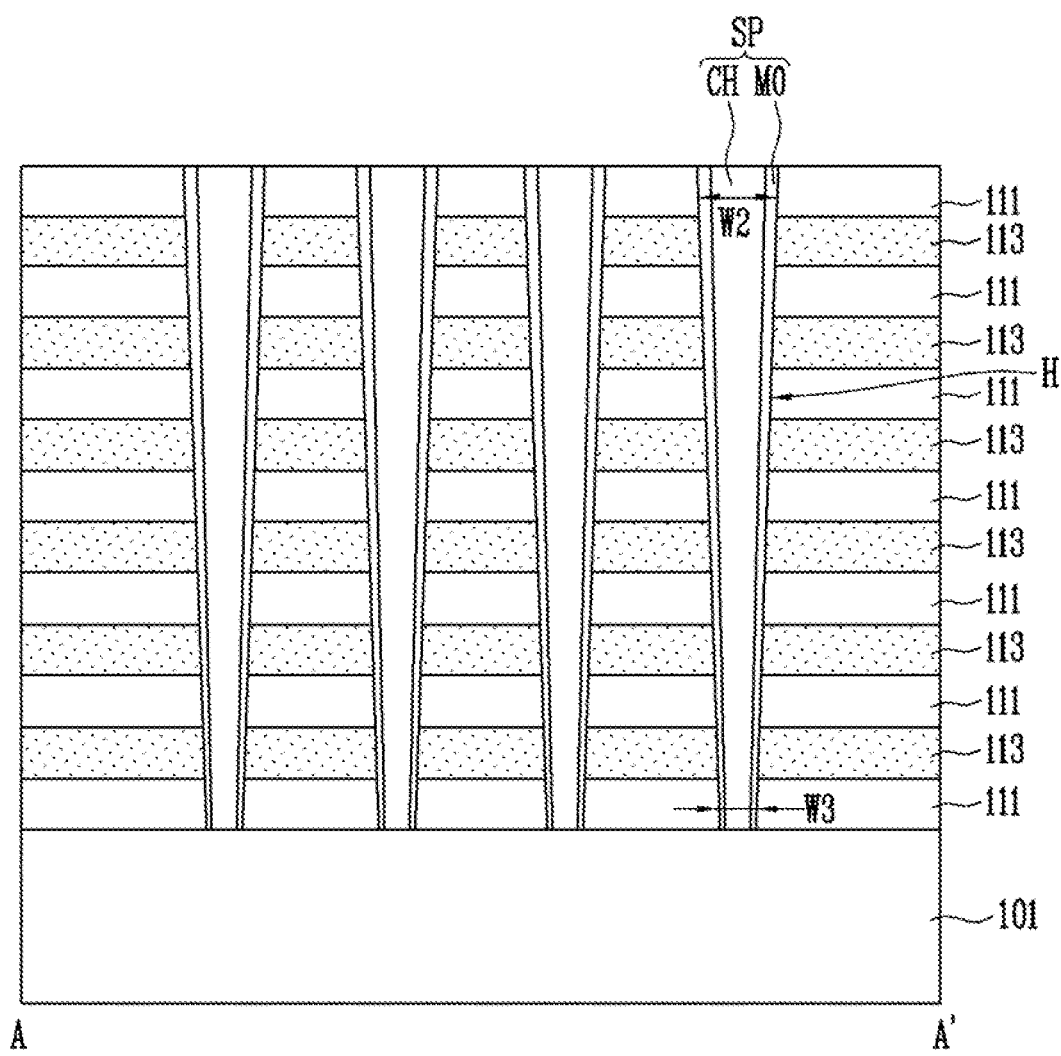
FIGS. 2A to 4C are diagrams for describing a method of manufacturing the semiconductor device according to an exemplary embodiment of the present invention.
Figure 2B:
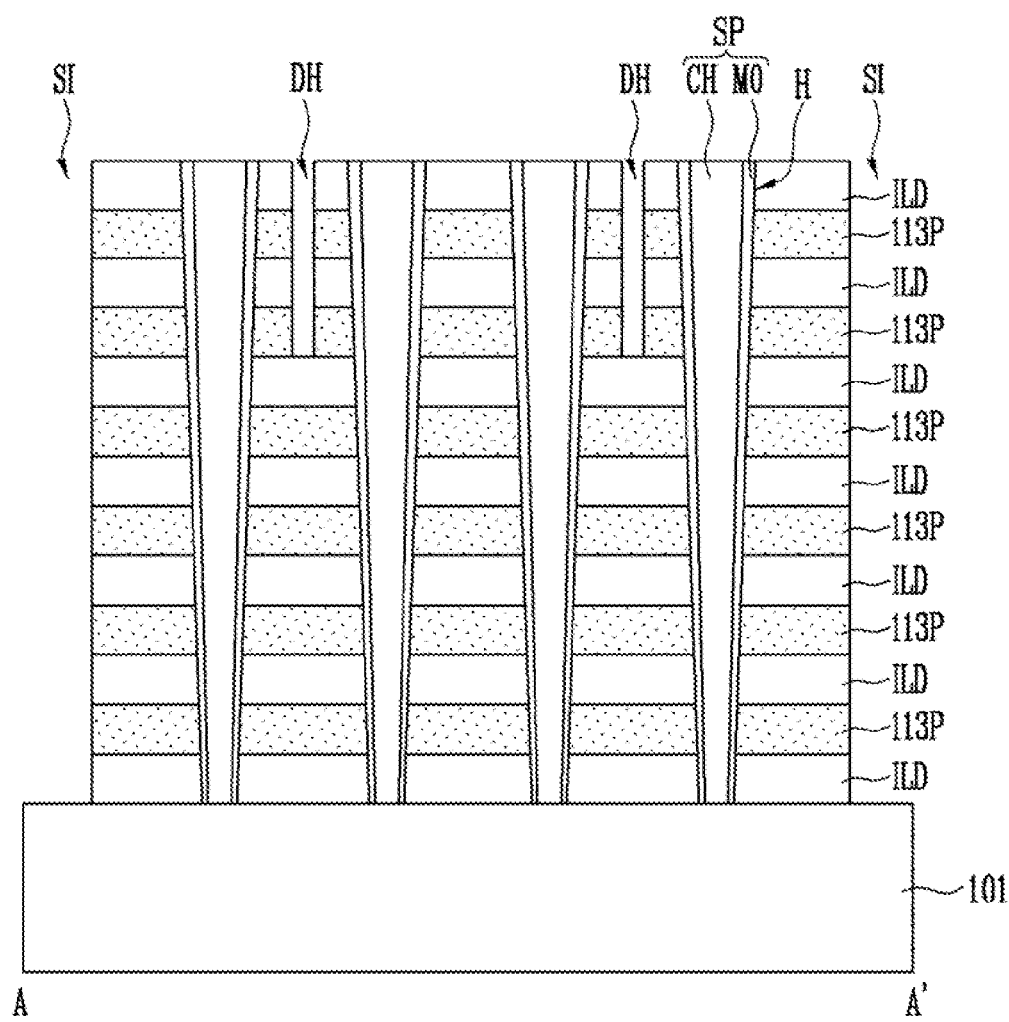

FIGS. 2A to 2C are cross-sectional views taken along line A-A' of FIG. 1A. Referring to FIG. 2A, interlayer insulating layers 111 and sacrificial layers 113 are alternately stacked on a lower structure 101. The sacrificial layers 113 may be formed of a material having different etch selectivity from the interlayer insulating layers 111. For example, the interlayer insulating layers 111 may be formed of a silicon oxide layer, and the sacrificial layers 113 may be formed of a silicon nitride layer.

Next, channel holes H passing through the interlayer insulating layers 111 and the sacrificial layers 113 are formed by etching the interlayer insulating layers 111 and the sacrificial layers 113. The channel holes H may be formed by a mask process and a photolithography process.

Then, the string pillars SP are formed inside the channel holes H. Each of the string pillars SP includes a memory layer MO and a channel pillar CH. The memory layer MO is formed along a sidewall of each of the channel holes H, and the channel pillar CH is disposed inside each of the channel holes H and surrounded by the memory layer MO. The memory layer MO may include the blocking insulating layer, the data storing layer, and the tunnel insulating layer aforementioned with reference to FIG. 1A. The channel pillar CH may include the buried semiconductor layer, the tube-type semiconductor layer, etc., as described with reference to FIG. 1A.

In the above, when the etch process for forming the channel holes H is performed, upper ends of the channel holes H tend to be etched more than lower ends of the channel holes H. Accordingly, each of the channel holes H may include the upper end having a larger width than that of the lower end. Further, a width of the string pillar SP formed inside each of the channel holes H gets narrower toward the lower structure 101. For example, a width W2 of the string pillar SP which is measured at the upper surface of the string pillar SP is greater than a width W3 of the string pillar SP which is measured at the upper surface the lower structure 101.

Referring to FIG. 2B, a first slit SI and dummy holes DH passing through the interlayer insulating layers 111 and the sacrificial layers 113 illustrated in FIG. 2A by different depths are formed. A process of forming the first slit SI and a process of forming the dummy holes DH may be separately performed. The process of forming the first slit SI may be performed before or after the process of forming the dummy holes DH.

The process of forming the first slit SI may be performed by a mask process and a photolithography process. The first slit SI may be formed by etching the interlayer insulating layers 111 and the sacrificial layers 113 so that the lower structure 101 is exposed. The first slit SI may divide the interlayer insulating layers 111 and the sacrificial layers 113 into a plurality of preliminary stack structures.

The process of forming the dummy holes DH may be performed by a mask process and a photolithography process. The dummy holes DH may be formed to a depth shorter than that of the first slit SI and the string pillar SP. When the dummy holes DH are formed to a depth the same as that of the first slit SI and the string pillars SP, a top of each of the dummy holes DH may be wide to open the string pillars SP. According to an exemplary embodiment of the present invention, since the depth of the dummy holes DH is shorter than that of the first slit SI and the string pillar SP, it is possible to prevent upper ends of the string pillars SP from being opened due to the dummy holes DH. The dummy holes DH may be formed between the string pillars SP and in the preliminary stack structures divided by the first slit SI.

Sacrificial patterns 113P and interlayer insulating patterns ILD are defined by the aforementioned first slit SI and dummy holes DH. The depth of the dummy holes DH may vary according to a distance between the adjacent string pillars SP. Lower surfaces of the dummy holes DH may be disposed either at the same level as interfaces between the sacrificial patterns 113P and the interlayer insulating patterns ILD or at a different level from the interfaces. When the lower surfaces of the dummy holes DH are disposed at a different level from the interfaces between the sacrificial patterns 113P and the interlayer insulating patterns ILD, the dummy holes DH may be formed to pass through part of the interlayer insulating patterns ILD but do not completely pass through all of the interlayer insulating patterns ILD. Likewise, the dummy holes DH may be formed to pass through part of the sacrificial patterns 113P but do not completely pass through all of the sacrificial patterns 113P.

Although not illustrated in the drawings, before the first slit SI and the dummy holes DH are formed, a block slit for dividing the interlayer insulating layers 111 and the sacrificial layers 113 of FIG. 2A by unit of memory block may be formed. Then, ends of the interlayer insulating layers 111 and the sacrificial layers 113 which are opened by the block slit may be patterned to form a step structure. Next, a planarizing insulating layer covering the step structure may be formed. The processes of forming the first slit SI and the dummy holes DH may be performed after the planarizing insulating layer is formed.

Referring to FIG. 2C, the sacrificial patterns 113P are removed through the dummy holes DH and the first slit SI. Accordingly, line pattern areas LPA are formed between the adjacent interlayer insulating patterns ILD. The sacrificial patterns 113P may be removed by using a selective etch process. For example, the sacrificial patterns 113P may be removed by using phosphoric acid which has selectivity for a silicon nitride layer.

In the above, an etch material removing the sacrificial patterns 113P may permeate through the dummy holes DH, as well as the first slit SI. Accordingly, it is possible to easily remove the sacrificial patterns 113P through the dummy holes DH.

Figure 3:
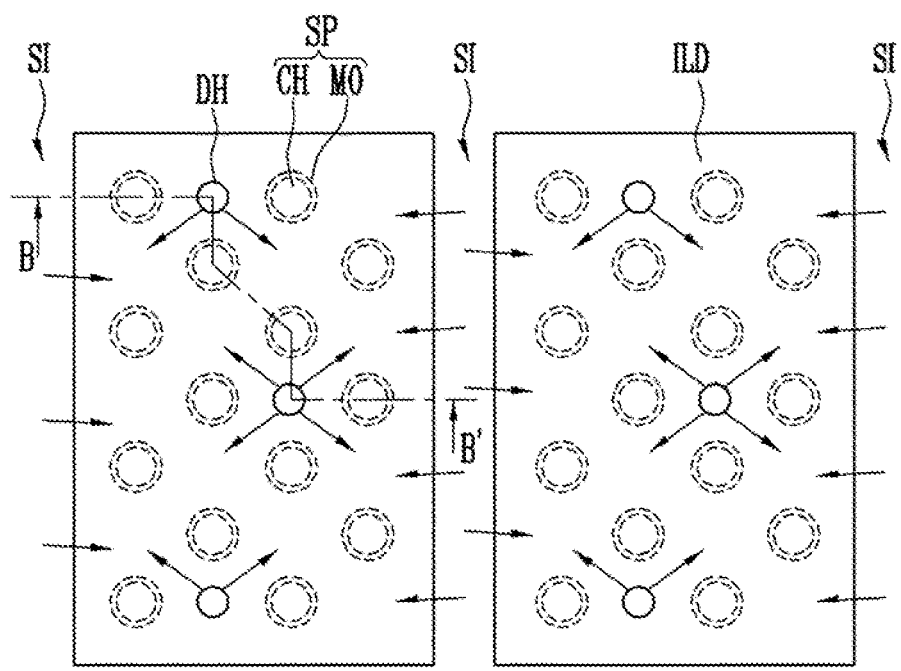

Hereinafter, a process of forming the conductive line patterns within the line pattern areas LPA will be described with reference to FIGS. 3 and 4A-4C. FIG. 3 is a top plan view of the memory device illustrated in FIG. 1A, and FIGS. 4A to 4C are cross-sectional views taken along line B-B' of FIG. 3.

Figure 4A:
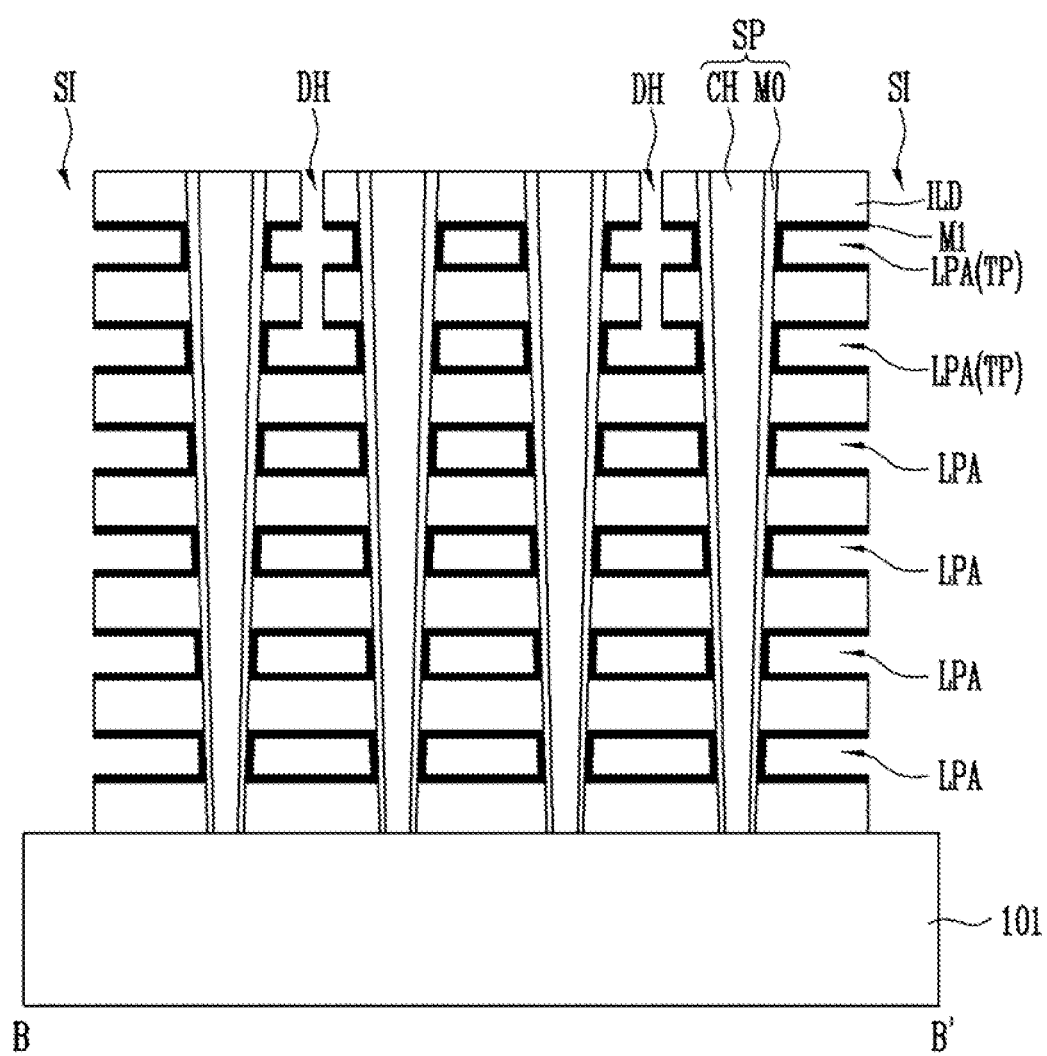

Referring to FIGS. 3 and 4A, a first conductive layer is formed along surfaces of the fine pattern areas LPA through the dummy holes DH and the first slit SI. The first conductive layer may be formed of a conductive material serving as the barrier metal layer.

When the dummy holes DH are not formed, a process defect may occur. For example, the first conductive layer may not be deposited on some of the line pattern areas LPA. Particularly, the first conductive layer may not be deposited on an upper line pattern area TP surrounding upper ends of the string pillars SP among the line pattern areas LPA. The upper ends of the string pillars SP are formed to have relatively larger widths as described with reference to FIG. 2A.

The upper ends of the string pillars SP may block a permeation path of the first conductive layer. The first conductive layer may be easily deposited on an edge of the upper line pattern area TP adjacent to the first slit SI, but a center portion of the upper line pattern area TP is blocked by the upper ends of the string pillars SP. Thus, it is difficult to deposit the first conductive layer on the center portion of the upper line pattern area TP. In the exemplary embodiment of the present invention, the dummy holes DH are disposed on the center portion of the upper line pattern area TP, so that it is possible to easily deposit the first conductive layer on the center portion of the upper line pattern area TP. Accordingly, in the exemplary embodiment of the present invention, it is possible to deposit the first conductive layer along the entire surfaces of the line pattern areas LPA. The first conductive layer may permeate in a direction of an arrow illustrated in FIG. 3.

After the first conductive layer is formed, a partial area of the first conductive layer formed along a lateral wall of the first slit SI and lateral walls of the dummy holes DH are removed. Accordingly, first conductive patterns M1 divided for each line pattern area LPA and along the surfaces of the line pattern areas LPA are formed.

Figure 4B:
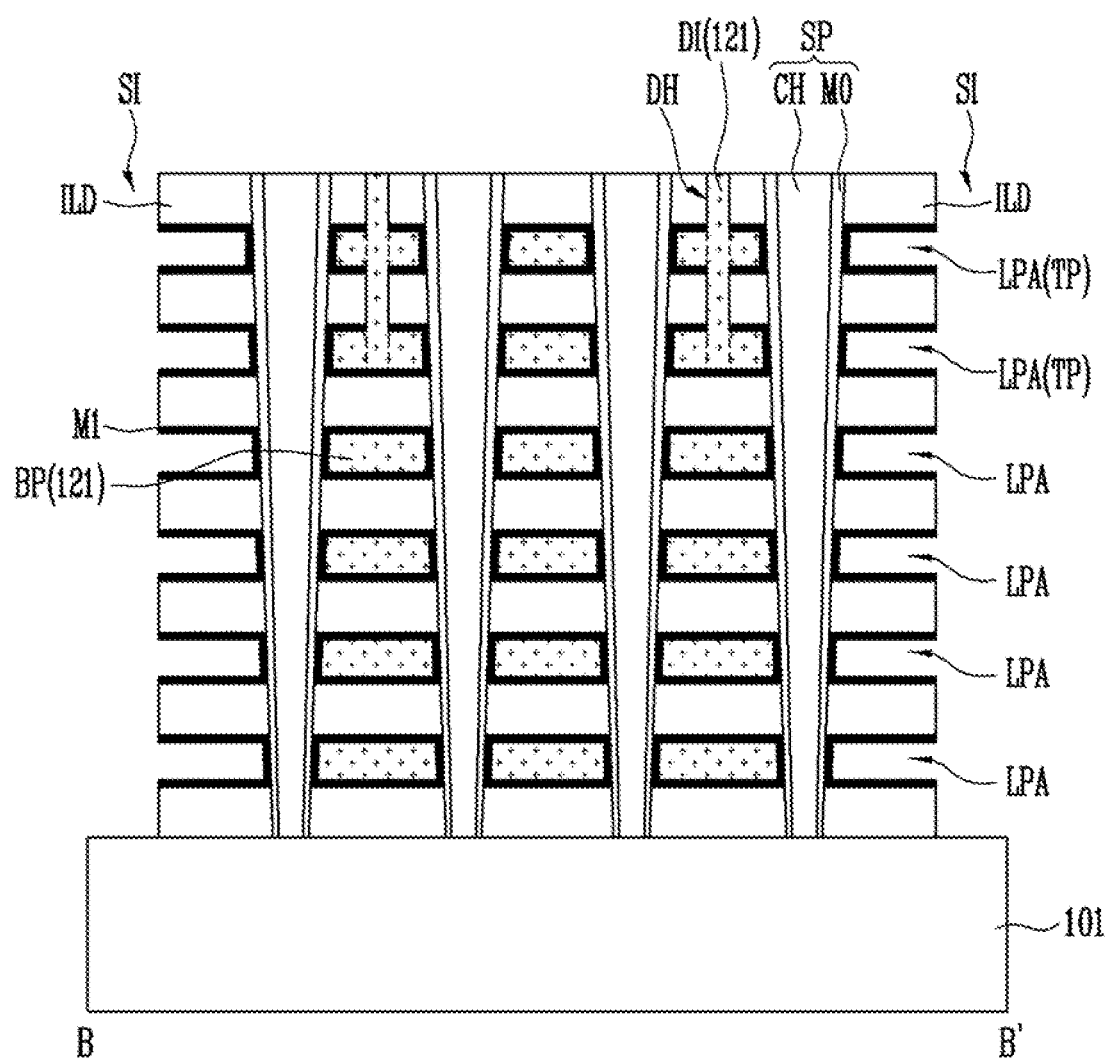

Referring to FIGS. 3 and 4B, after the first conductive patterns M1, a non-conductive material layer 121 is formed on the first conductive patterns M1 through the dummy holes DH and the first slit SI. The non-conductive material layer 121 may be formed of a material which does not generate fume damaging the memory layer MO as described with reference to FIG. 1A.

In the exemplary embodiment of the present invention, the dummy holes DH are disposed on the center portion of the upper line pattern area TP, so that it is possible to easily deposit the non-conductive material layer 121 on the center portion of the upper line pattern area TP. The non-conductive material layer 121 may permeate in a direction of an arrow illustrated in FIG. 3.

After the non-conductive material layer 121 is formed, a partial area of the non-conductive material layer 121 formed along the lateral wall of the first slit SI and the lateral walls of the dummy holes DH are removed. In this case, a partial area of the non-conductive material layer 121 within the line pattern areas LPA is removed so that edges of the line pattern areas LPA are opened. Accordingly, non-conductive patterns BP divided by the first slit SI may be formed. The non-conductive material layer 121 remaining inside the dummy hole DH may serve as a dummy insulating plug DI. Although not illustrated in the drawing, the non-conductive material layer 121 inside the dummy holes DH is removed, so that the first conductive patterns M1 may be exposed through the dummy holes DH.

Figure 4C:
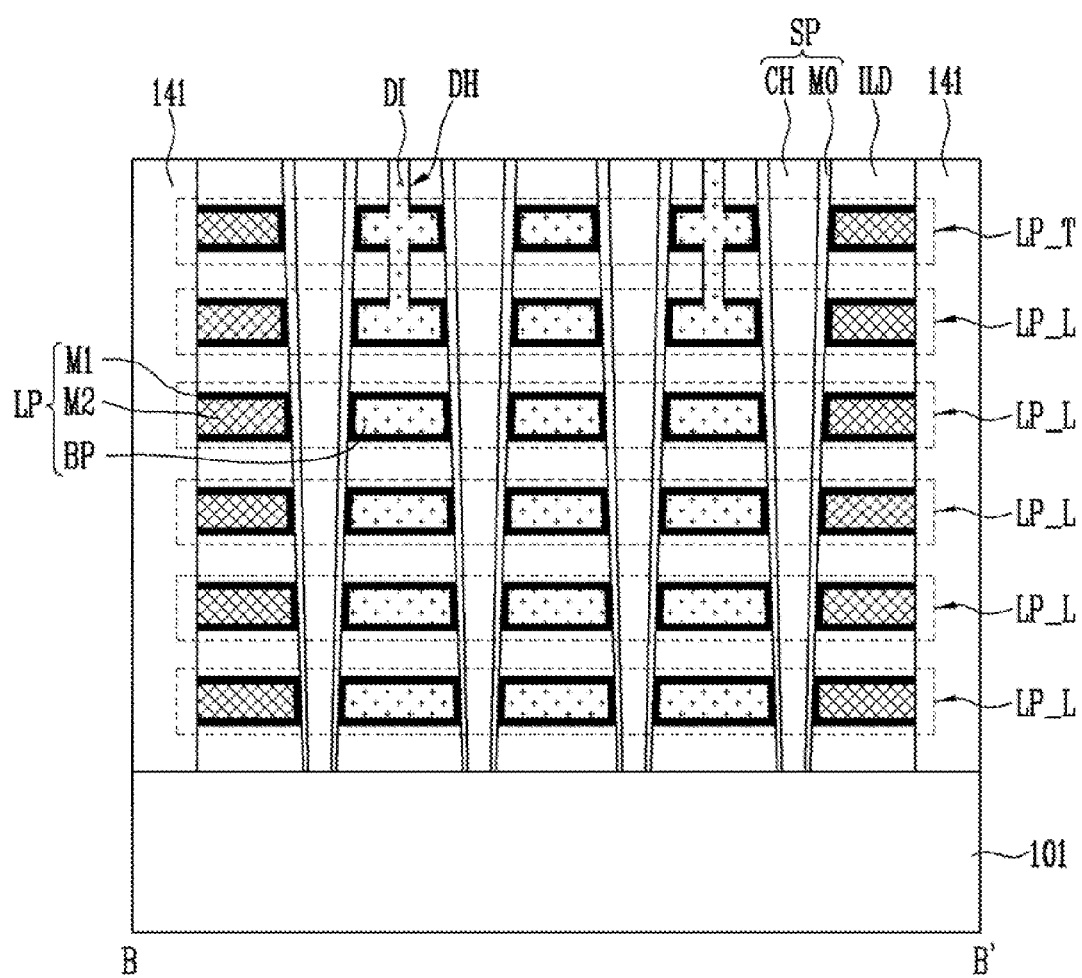

Referring to FIGS. 3 and 4C, the edges of the line pattern areas LPA opened by the non-conductive patterns BP are filled with a second conductive layer. The second conductive layer may be formed at the edges of the line pattern areas LPA through the first slit SI. The second conductive layer is formed on the non-conductive patterns BP and the first conductive patterns M1. The second conductive layer may be formed of a metal layer capable of reducing resistance as described with reference to FIG. 1A. Although not illustrated in the drawing, when the non-conductive material layer 121 is removed from the dummy holes DH, the second conductive layer may fill inside the dummy holes DH.

Fume, which may damage the memory layer MO, may be generated during the aforementioned process of forming the second conductive layer. The fume damaging the memory layer MO may be discharged to the outside through the first slit SI. In the exemplary embodiment of the present invention, it is possible to prevent a void from being formed while the first conductive layer and the non-conductive material layer 121 are formed by disposing the dummy holes DH at a center portion of the upper line pattern area TP (see FIGS. 4A and 4B). Accordingly, in the exemplary embodiment of the present invention, since no void is present in the first conductive layer and the non-conductive material layer 121, it is possible to prevent the fume damaging the memory layer MO from permeating into the void and remaining in the void.

After the second conductive layer is formed, partial areas of the second conductive layer formed along the lateral wall of the first slit SI are removed. Thereby, an upper second conductive pattern M2 is separated from a lower second conductive pattern M2. The separated second conductive patterns M2 fill in the edges of the line pattern areas LPA, respectively.

Although not illustrated in the drawings, when the second conductive layer is filled inside the dummy holes DH, the second conductive layer inside the dummy holes DH may be removed during the process of removing the partial area of the second conductive layer. In this case, the fume generated during the process of forming the second conductive layer may be easily discharged to the outside through the dummy holes DH.

Then, a first isolation insulating Dyer 141 filled in the first slit SI is formed. Although not illustrated in the drawings, when the dummy holes DH are opened, the dummy holes DH may be filled with the dummy insulating plug DI by using the process of forming the first isolation insulating layer 141.

As described above, in the exemplary embodiment of the present invention, it is possible to decrease a defect in the manufacturing process of the 3D memory device by providing a discharge path of fume damaging the memory layer MO or providing inflow paths of the first conductive layer and the non-conductive material layer by using the dummy holes. Accordingly, in the exemplary embodiment of the present invention, it is possible to improve reliability of the 3D memory device by preventing degradation of an operation characteristic of the 3D memory device due to the defect in the manufacturing process.

Upper conductive patterns LP_T on one or more layers from the uppermost layer among the line conductive patterns LP may be used as select lines. When the select lines are formed in the same pattern as that of lower conductive patterns LP_L under the select lines, a subsequent process for forming an upper structure, such as bit lines, may be performed after performing the process aforementioned with reference to FIG. 4C.

Figure 5:
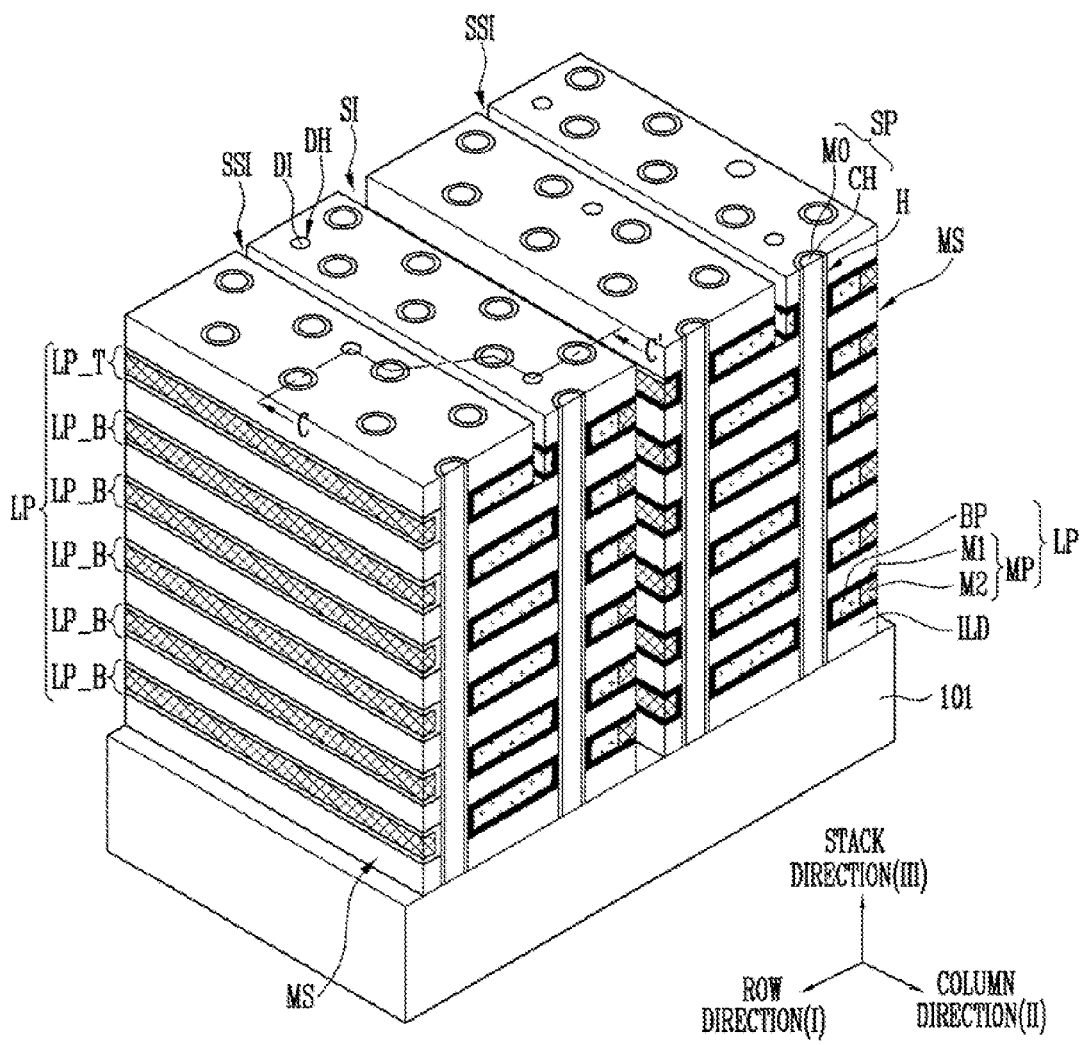
FIGS. 5 and 6 are diagrams for describing a semiconductor device and a method of manufacturing the semiconductor device according to an exemplary embodiment of the present invention.
Figure 6:
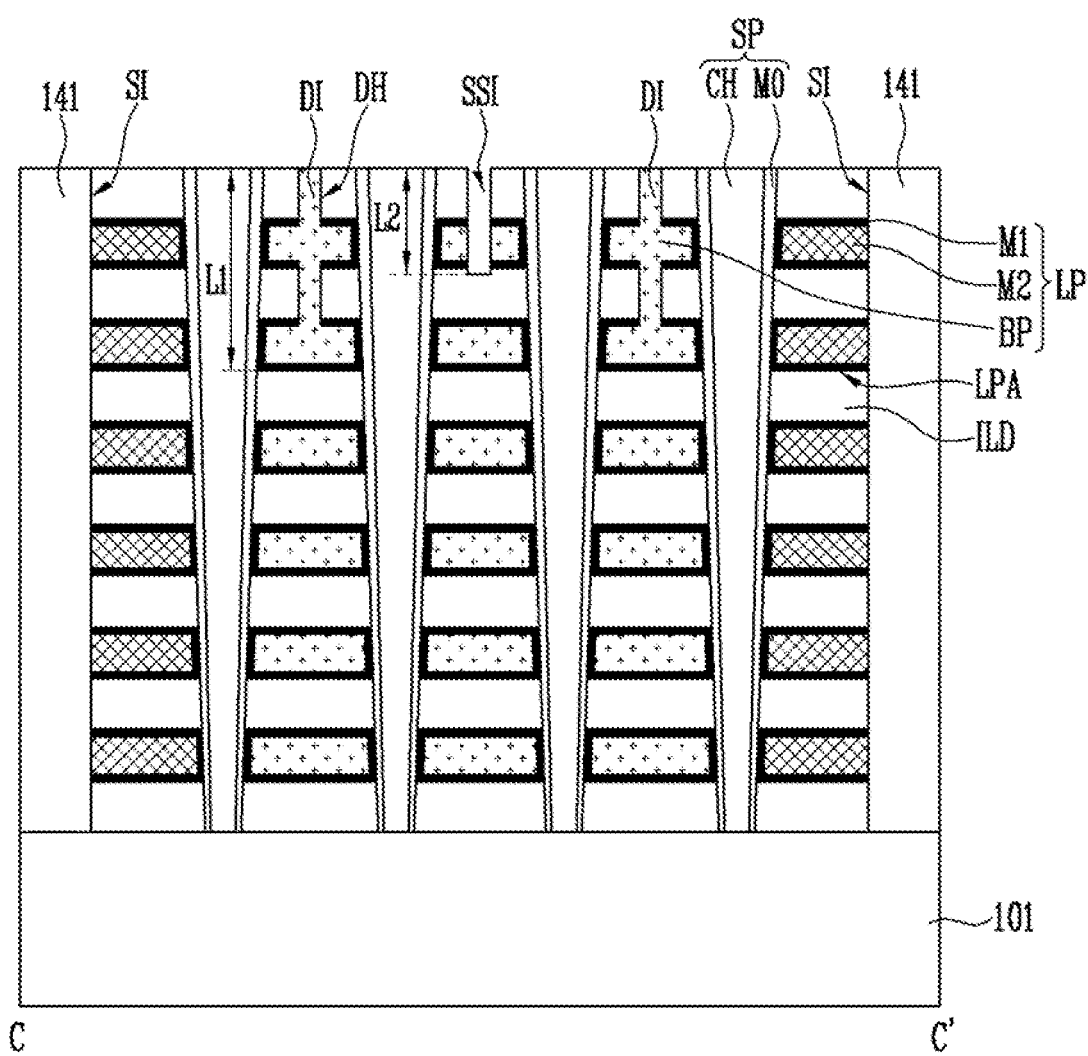

FIGS. 5 to 6 are diagrams for describing a semiconductor device according to an exemplary embodiment of the present invention, and a method of manufacturing the same. Particularly, FIGS. 5 and 6 illustrate a case where upper conductive line patterns on one or more layers from the uppermost layer among the conductive line patterns are divided into smaller units than that of line conductive patterns lower than the upper conductive line patterns, in comparison with the exemplary embodiments aforementioned with reference to FIGS. 1A to 4C.

Hereinafter, constituent elements denoted by the same reference numerals as those illustrated in FIGS. 1A to 4C have the same structures as those aforementioned with reference to FIGS. 1A to 4C, and detailed descriptions of the same structures will be omitted for conciseness.

Referring to FIGS. 5 and 6, conductive line patterns LP according to the exemplary embodiment of the present invention may be divided into upper conductive line patterns LP_T and lower conductive line patterns LP_B under the upper conductive line patterns LP_T. The upper conductive line patterns LP_T may be formed with smaller widths than those of the lower conductive line patterns LP_B. The upper conductive line patterns LP_T may be used as select lines. The lower conductive line patterns LP_B may be used as word lines. In another embodiment, the lower conductive line patterns LP_B may be divided into word lines and lower select lines under the word lines.

A first slit SI may divide the lower conductive line patterns LP_B. The upper conductive line patterns LP_T may be divided by the first slit SI and a second slit SSI. The second slit SSI may overlap the lower conductive line patterns LP_B. The second slit SSI may be formed in a line type. The second slit SSI may extend in the column direction (II) and may be connected to the dummy holes DH which are arranged in the column direction (II).

The dummy holes DH are formed as a hole type, so that it is easy to be formed deeper than the second slit SSI as the line type. Accordingly, a depth L1 of the dummy hole DH may be formed deeper than a depth L2 of the second slit SSI. That is, when the second slit SSI is formed, the depth L2 of the second slit SSI may be formed shallower than the depth L1 of the dummy hole DH.

The aforementioned second slit SSI may be formed by passing through some of the line patterns LP after the first isolation insulating layer 141 is formed as shown in FIG. 4C. After the second slit SSI is formed, a second isolation insulating layer may be filled inside the second slit SSI. Then, a subsequent process of forming an upper structure, such as bit lines, may be performed.

Figure 7:
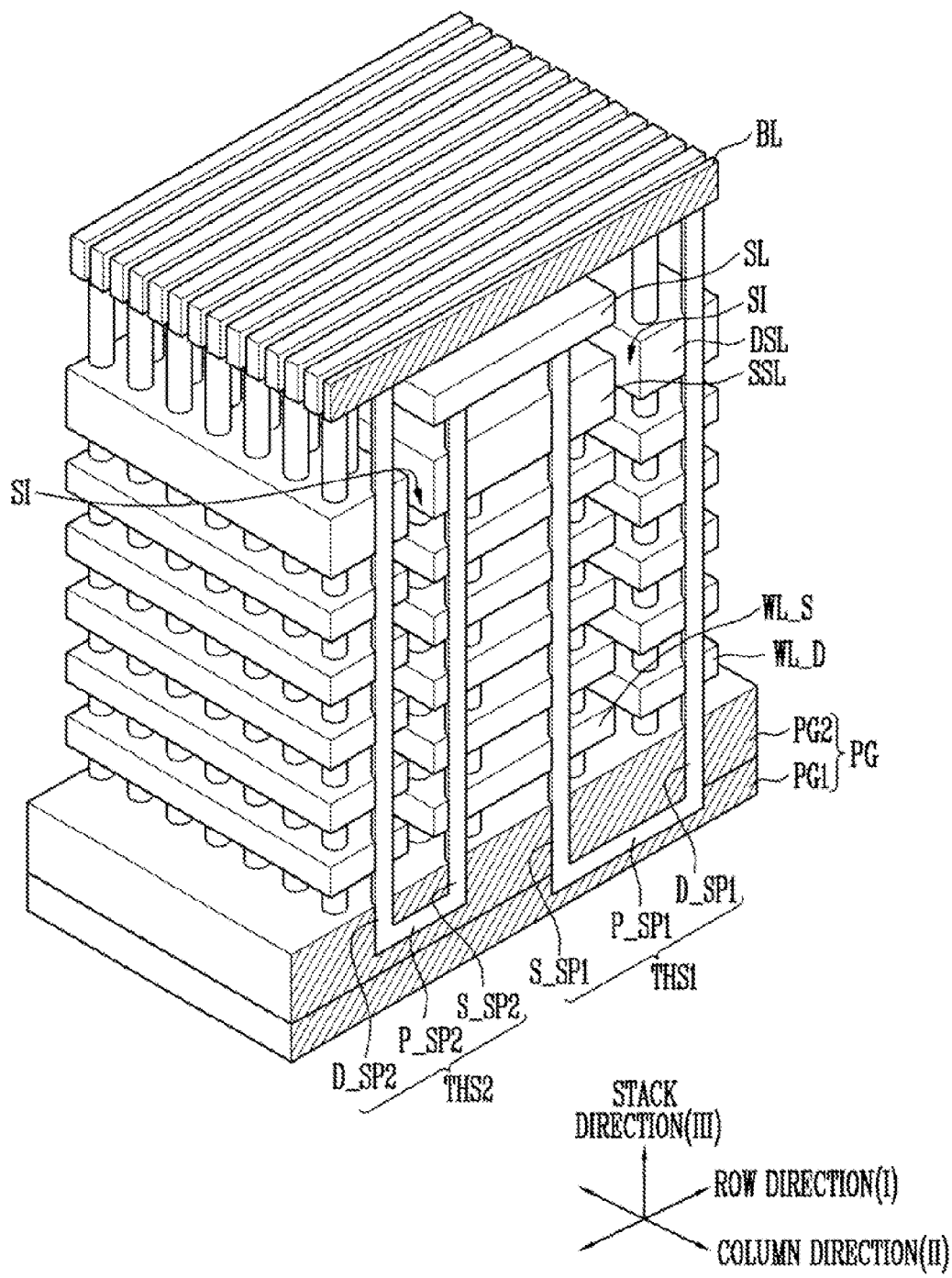
FIGS. 7 and 8 are diagrams for describing 3D memory devices according to the exemplary embodiments of the present invention.
Figure 8:
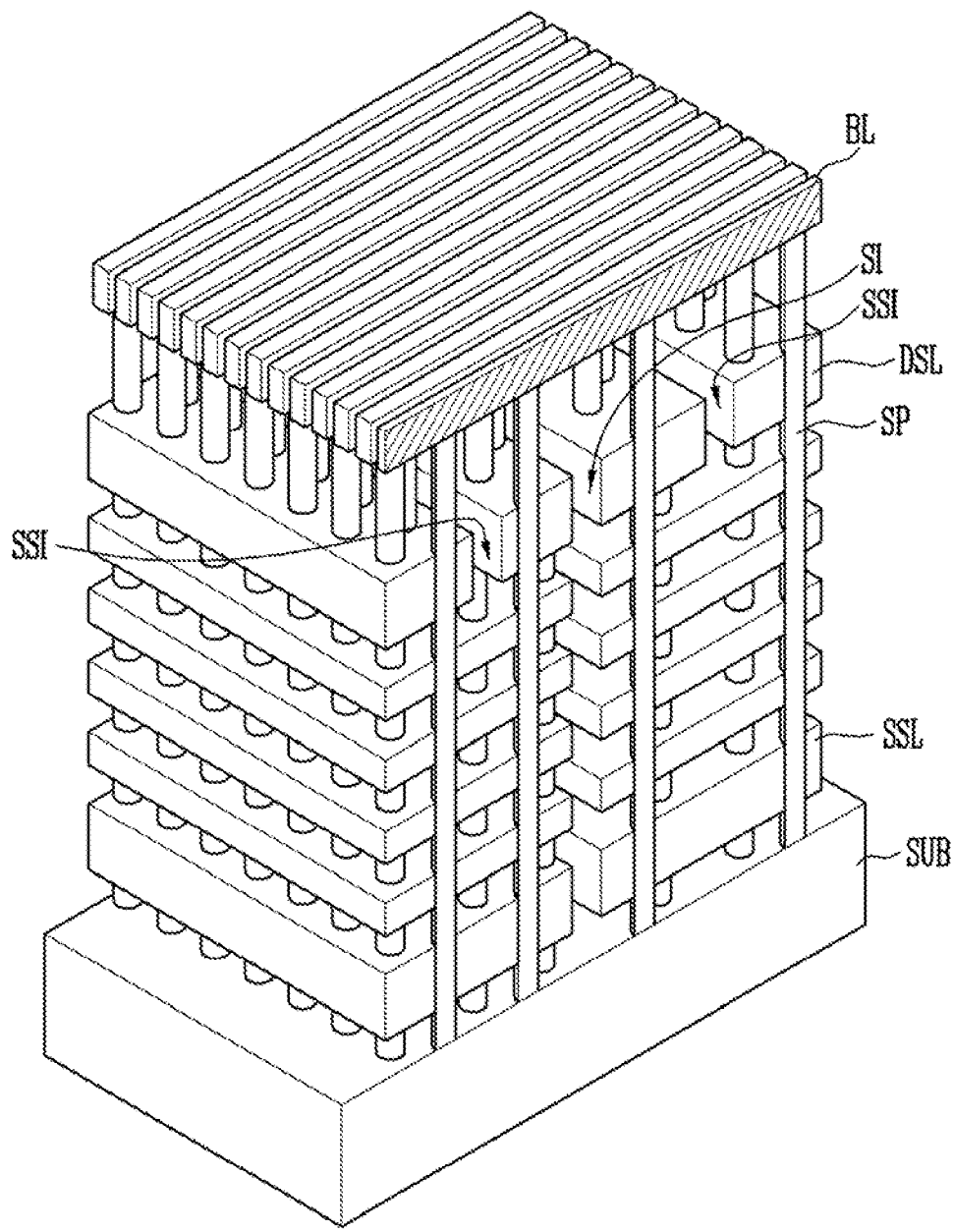

FIGS. 7 and 8 are diagrams for describing the 3D memory devices according to the exemplary embodiments of the present invention. FIG. 7 illustrates a memory cell in a U-shape. Each of through structures THS1 and THS2 forms a U-shaped memory string. As illustrated in FIG. 7, the U-shaped through structures THS1 and TH2 may include a first through structure THS1 and a second through structure THS2.

The first through structure THS1 may include a first pipe structure P_SP1, a first source side pillar structure S_SP1, and a first drain side pillar structure D_SP1. The first source side pillar structure S_SP1 and the first drain side pillar structure D_SP1 protrude from the first pipe structure P_SP1. The first through structure THS1 may include a memory layer configuring external walls of the first pipe structure P_SP1, the first source side pillar structure S_SP1 and the first drain side pillar structure D_SP1, and a channel layer surrounded by the memory layer, and configuring center portions of the first pipe structure P_SP1, the first source side pillar structure S_SP1, and the first drain side pillar structure D_SP1. Materials of the memory layer and the channel layer are the same as the materials configuring the memory layer and the channel pillar aforementioned with reference to FIG. 1A.

The second through structure THS2 may include a second pipe structure P_SP2, a second source side pillar structure S_SP2, and a second drain side pillar structure D_SP2. The second source side pillar structure S_SP2 and the second drain side pillar structure D_SP2 protrude from the second pipe structure P_SP2. The second through structure THS2 may include a memory layer configuring external walls of the second pipe structure P_SP2, the second source side pillar structure S_SP2, and the second drain side pillar structure D_SP2, and a channel layer surrounded by the memory layer, and configuring center portions of the second pipe structure P_SP2, the second source side pillar structure S_SP2, and the second drain side pillar structure D_SP2. Materials of the memory layer and the channel layer are the same as the materials configuring the memory layer and the channel pillar aforementioned with reference to FIG. 1A.

The first and second pipe structures P_SP1 and P_SP2 are disposed at different levels from each other. For example, the second pipe structure P_SP2 disposed at a relatively higher level may be formed to be shorter than the first pipe structure P_SP1. The first pipe structure P_SP1 and the second pipe structure P_SP2 may be alternately disposed in the row direction I or the column direction II.

The first and second pipe structures P_SP1 and P_SP2 may be surrounded by a pipe gate PG. The pipe gate PG includes a first pipe gate PG1 surrounding the first pipe structure P_SP1, and the second pipe gate PG2 surrounding the second pipe structure P_SP2. The second pipe structure P_SP2 may be formed on the first pipe gate PG1. The first and second pipe structures P_SP1 and P_SP2 and the pipe gate PG may form the lower structure as aforementioned with reference to FIGS. 1A to 6.

The first and second source side pillar structures S_SP1 and S_SP2 may be surrounded by a source side stack structure. The source side stack structure may include source side word lines WL_S and a source select line(s) SSL disposed on the source side word lines WL_S. The first and second drain side pillar structures D_SP1 and D_SP2 may be surrounded by a drain side stack structure. The drain side stack structure may include drain side word lines WL_D and a drain select line(s) DSL which is disposed on the drain side word lines WL_D.

The source side stack structure and the drain side stack structure may be separated from each other by the first slit SI. The first drain side pillar structure D_SP1 and the second drain side pillar structure D_SP2 are connected to a bit line BL. The first source side pillar structure S_SP1 and the second source side pillar structure S_SP2 are connected to a source line SL.

The first and second source side pillar structures S_SP1 and S_SP2 and the first and second drain side pillar structures D_SP1 and D_SP2 may correspond to the string pillar aforementioned with reference to FIGS. 1A to 6.

The source side word lines WL_S, the source select line SSL, the drain side word lines WL_D, and the drain select line DSL may correspond to the conductive line pattern aforementioned with reference to FIGS. 1A to 6. Particularly, the source select line SSL and the drain select line DSL may correspond to the upper conductive line pattern aforementioned with reference to FIGS. 1A to 6. The bit line BL and the source line SL may correspond to the upper structure aforementioned with reference to FIGS. 4C to 6.

According to the structure illustrated in FIG. 7, a pipe transistor is formed at a crossing portion of the pipe gate PG and the first pipe structure P_SP1 or a crossing portion of the pipe gate PG and the second pipe structure P_SP2. Drain side memory cells are formed at crossing portions of the drain side word lines WL_D and the first and second drain side pillar structures D_SP1 and D_SP2. Source side memory cells are formed at crossing portions of the source side word lines WL_S and the first and second source side pillar structures S_SP1 and S_SP2. Source select transistors are formed at crossing portions of the source select line SSL and the first and second source side pillar structures S_SP1 and S_SP2. Drain select transistors are formed at crossing portions of the drain select line DSL and the first and second drain side pillar structures D_SP1 and D_SP2. Accordingly, the drain select transistor, the drain side memory cells, the pipe transistor, the source side memory cells, and the source select transistor, which are serially connected along each of the first and second through structures THS1 and THS2, may configure the U-shaped memory string. The U-shaped memory string is connected between the bit line BL and the source line SL to configure the 3D memory device.

FIG. 8 illustrates a case where the memory cells are arranged along a straight string pillar SP to configure a straight memory string. As illustrated in FIG. 8, the straight string pillar SP is in contact with a substrate SUB which includes a source area. The string pillar SP may include a channel pillar and a memory layer surrounding an external wall of the channel pillar as described with reference to FIG. 1A. A bit line BL may be connected onto the string pillar SP.

The substrate SUB including a source area may correspond to the lower structure aforementioned with reference to FIGS. 1A to 6. The string pillar SP may be surrounded by source select lines SSL of one or more layers, word lines WL stacked on the source select line SSL, and drain select lines DSL of one or more layers stacked on the word lines WL. The source select line SSL, the word lines WL stacked on the source select line SSL, and the drain select line DSL stacked on the word lines WL may be separated by the first slit SI. The drain select line DSL may be separated by the second slit SSI into smaller units. The divided drain select line DSL has a smaller width than that of the word lines WL.

The source select line SSL, the word lines WL, and the drain select line DSL may correspond to the conductive line pattern aforementioned with reference to FIGS. 1A to 6. For example, the drain select line DSL may correspond to the upper conductive line pattern aforementioned with reference to FIGS. 1A to 6.

The bit line BL may correspond to the upper structure aforementioned with reference to FIGS. 4C to 6. According to the structure illustrated in FIG. 8, a select transistor is formed at a crossing portion of the source select line SSL and the string pillar SP. Memory cells are formed at crossing portions of the word lines WL and the string pillar SP. A drain select transistor is formed at a crossing portion of the drain select line DSL and the string pillar SP. Accordingly, the source select transistor, the memory cells, and the drain select transistor, which are serially connected along the string pillar SP, may configure the straight memory string. The straight memory strings are arranged in a matrix form in the row direction and the column direction to configure the 3D memory device.

In the exemplary embodiments of the present invention, the sacrificial layers may be removed or the conductive line patterns may be formed through the dummy holes, thereby decreasing a defect in the manufacturing process and a structural defect of the 3D memory device. Accordingly, in the exemplary embodiments of the present invention, it is possible to improve reliability of the 3D memory device.

Figure 9:
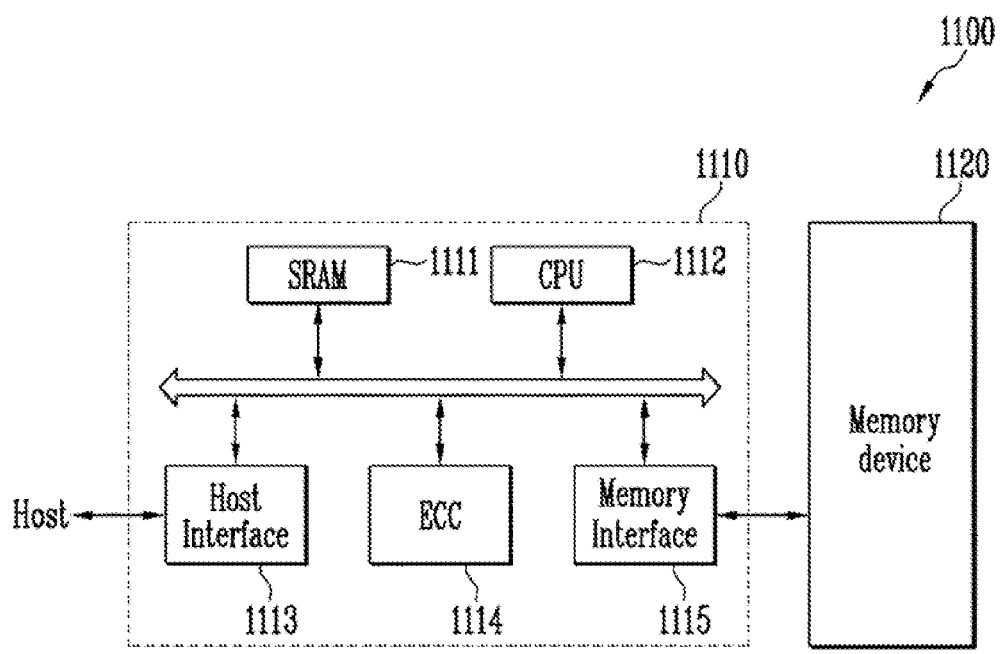
FIG. 9 is a configuration diagram illustrating a memory system according to an exemplary embodiment of the present invention.

FIG. 9 is a configuration diagram illustrating a memory system according to an exemplary embodiment of the present invention. Referring to FIG. 9, a memory system 1100 according to an exemplary embodiment of the present invention includes a memory device 1120 and a memory controller 1110. The memory device 1120 has the structures described in the exemplary embodiments described with reference to FIGS. 1A to 8. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 is used as an operation memory of the CPU 1112. The CPU 1112 performs a general control operation for data exchange of the memory controller 1110, and the host interface 1113 includes a data exchange protocol of the host connected to the memory system 1100. Further, the ECC 1114 detects and corrects an error included in data read from the memory device 1120, and the memory interface 1115 performs interfacing with the memory device 1120. In addition, the memory controller 1110 may further include an ROM and the like for storing code data for the interfacing with the host.

As described above, the memory system 1100 including the aforementioned configuration may be a memory card or a Solid State Disk (SSD) in which the memory device 1120 is combined with the memory controller 1110. For example, when the memory system 1100 is the SSD, the memory controller 1110 may communicate with an external device for example, a host through one of various interface protocols, such as USB, MMC, PCI-E, SATA, PATA, SCSI, ESDI, and IDE.

Figure 10:
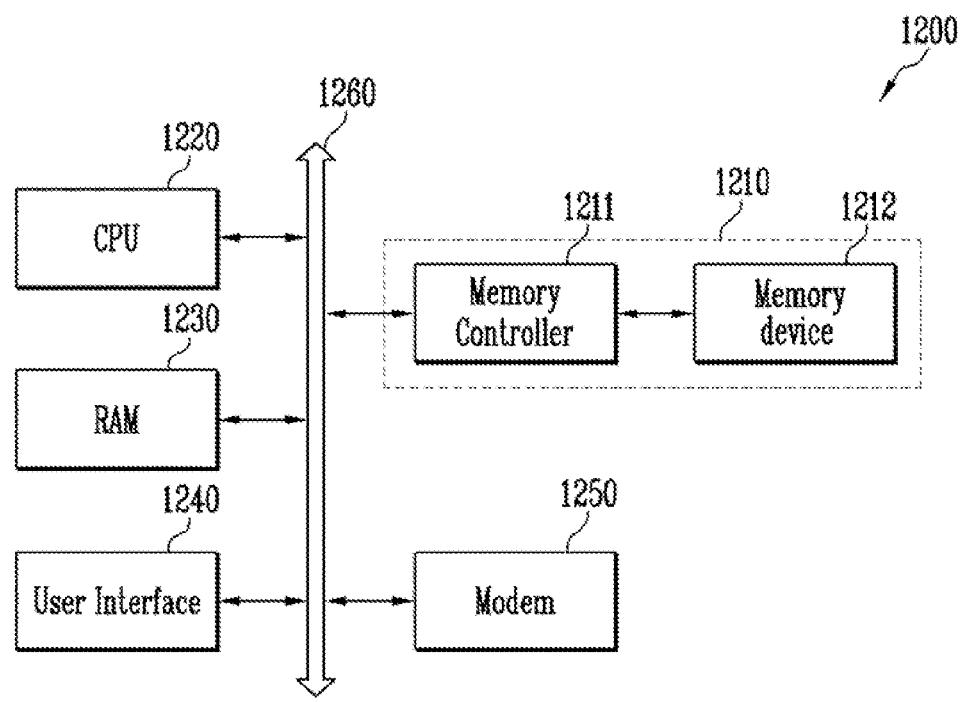
FIG. 10 is a configuration diagram illustrating a computing system according to an exemplary embodiment of the present invention.

FIG. 10 is a configuration diagram illustrating a computing system according to an exemplary embodiment of the present invention. Referring to FIG. 10, a computing system 1200 according to the exemplary embodiment of the present invention may include a CPU 1220, a RAM 1230, a user interface 1240, a modem 1250, and a memory system 1210, which are electrically connected to a system bus 1260. Furthermore, when the computing system 1200 is a mobile device, the computing system 1200 may further include a battery for supplying an operational voltage to the computing system 1200, and may further include an application chip-set, a camera image sensor CIS, a mobile DRAM, and the like. The memory system 1210 may be formed of a memory device 1212 and a memory controller 1211 as previously described with reference to FIG. 9.

What is claimed is:

1. A semiconductor device, comprising:
    stack structures including interlayer insulating patterns and conductive line patterns, which are alternately stacked;
    a first slit between the stack structures;
    string pillars passing through the stack structures; and
    dummy holes passing through top portions of the stack structures to be spaced apart from bottom surface of the stack structures and disposed between the string pillars,
    wherein each of the dummy holes is filled with a filling material different from materials of structures of the string pillars, and
    wherein each of the conductive line patterns includes:
        a first conductive pattern formed in a line pattern area between two interlayer insulating patterns, which are arranged adjacent to each other in the vertical direction, and formed along surfaces of the interlayer insulating patterns and the string pillars;
        a second conductive pattern provided in the line pattern area and provided over the first conductive pattern; and
        a non-conductive pattern provided in the line pattern area, provided between each of the string pillars and the first conductive pattern, and surrounded by the first conductive pattern.

2. The semiconductor device of claim 1, wherein each of the string pillars structures includes:
    a channel pillar; and
    a memory layer surrounding the channel pillar.

3. The semiconductor device of claim 1, wherein depths of the dummy holes which are measured from upper surfaces of the stack structures are smaller than depths of the string pillars which are measured from the upper surfaces of the stack structures.

4. The semiconductor device of claim 1, wherein the non-conductive pattern is filled in the dummy holes.

5. The semiconductor device of claim 1, wherein the first conductive pattern includes a titanium layer, a titanium nitride layer, a tantalum layer, a tantalum nitride layer, or a combination thereof,
    wherein the non-conductive pattern includes an oxide layer, a nitride layer, a silicon oxide layer, a silicon nitride layer, or a combination thereof, and
    wherein the second conductive pattern includes a tungsten layer, a tungsten nitride layer, or a combination thereof.

6. The semiconductor device of claim 1, wherein the dummy hole is filled with a non-conductive material.

7. The semiconductor device of claim 1, wherein widths of the dummy holes are smaller than widths of the string pillars.

8. The semiconductor device of claim 1, further comprising:
    a pipe structure connecting two or more of the string pillars to each other.

* * * * *